United States Patent
Holz et al.

(10) Patent No.: US 10,838,307 B2
(45) Date of Patent: Nov. 17, 2020

(54) APPARATUS AND METHOD FOR OPERATING AN APPARATUS

(71) Applicant: Carl Zeiss SMT GmbH, Oberkochen (DE)

(72) Inventors: Markus Holz, Aalen (DE); Ulrich Bihr, Kirchheim/Dirgenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/520,047

(22) Filed: Jul. 23, 2019

(65) Prior Publication Data

US 2019/0346772 A1 Nov. 14, 2019

Related U.S. Application Data

(63) Continuation of application No. PCT/EP2017/052173, filed on Feb. 1, 2017.

(51) Int. Cl.
*G03F 7/20* (2006.01)

(52) U.S. Cl.
CPC ...... *G03F 7/70308* (2013.01); *G03F 7/70491* (2013.01)

(58) Field of Classification Search
CPC .............. G03F 7/70825; G03F 7/70308; G03F 7/70525; G03F 7/70533; G03F 7/7085
See application file for complete search history.

(56) References Cited

U.S. PATENT DOCUMENTS

| | | | |
|---|---|---|---|
| 7,295,776 B2 * | 11/2007 | Okubo | H04L 12/437 398/10 |
| 2006/0103908 A1 | 5/2006 | Loopstra et al. | |
| 2009/0002668 A1 * | 1/2009 | Rohe | G03F 7/70116 355/67 |
| 2009/0268180 A1 * | 10/2009 | Damen | G03F 7/70825 355/53 |
| 2012/0044474 A1 | 2/2012 | Hauf et al. | |

FOREIGN PATENT DOCUMENTS

| | | |
|---|---|---|
| DE | 10 2013 209 442 A1 | 11/2014 |
| WO | WO 2009/100856 A1 | 8/2009 |
| WO | WO 2010/049076 A2 | 5/2010 |
| WO | WO 2016/131758 A1 | 8/2016 |

OTHER PUBLICATIONS

International Search Report for corresponding PCT Appl No. PCT/EP2017/052173, dated Oct. 27, 2017.

* cited by examiner

*Primary Examiner* — Steven Whitesell Gordon
(74) *Attorney, Agent, or Firm* — Fish & Richardson P.C.

(57) ABSTRACT

An apparatus, for example a lithography apparatus or a multi-mirror system, includes comprises a radiation source for generating radiation, a plurality of optical components for guiding the radiation in the apparatus, a plurality of actuator/sensor devices for the optical components, and a drive device for driving the actuator/sensor devices.

20 Claims, 5 Drawing Sheets

APPARATUS AND METHOD FOR OPERATING AN APPARATUS

FIELD

The present disclosure relates to an apparatus, for example a lithography apparatus or a multi-mirror system, and a method for operating an apparatus. The apparatus or lithography apparatus comprises a radiation source for generating radiation, a plurality of optical components for guiding the radiation in the apparatus, a plurality of actuator/sensor devices for the optical components, and a drive device for driving the actuator/sensor devices.

BACKGROUND

Microlithography is used for producing microstructured components, such as for example integrated circuits. The microlithography process is performed using a lithography apparatus, which has an illumination system and a projection system. The image of a mask (reticle) illuminated via the illumination system is in this case projected via the projection system onto a substrate (for example a silicon wafer) coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light with a wavelength in the range of 0.1 nm to 30 nm, in particular 4 nm to 6 nm, are currently under development. In the case of such EUV lithography apparatuses, because of the high absorption of light of this wavelength by most materials, reflective optical units, that is to say mirrors, are used instead of—as previously—refractive optical units, that is to say lens elements. For the same reason, beam shaping and beam projection is desirably performed in a vacuum.

The mirrors may for example be secured to a supporting frame (force frame) and be configured to be at least partially manipulable or tiltable in order to allow a movement of a respective mirror in up to six degrees of freedom, and consequently a highly accurate positioning of the mirrors in relation to one another, in particular in the pm range. This allows changes in the optical properties that occur for instance during the operation of the lithography apparatus, for example as a result of thermal influences, to be corrected.

For the purposes of moving the mirrors, in particular in the six degrees of freedom, actuators which are driven by way of a control loop are assigned to the mirrors. A device for monitoring the tilt angle of a respective mirror is provided as part of the control loop.

For example, WO 2009/100856 A1 discloses a facet mirror for a projection exposure apparatus of a lithography apparatus, which facet mirror has a multiplicity of individually displaceable individual mirrors. To ensure the optical quality of a projection exposure apparatus, very precise positioning of the displaceable individual mirrors is used.

For the purpose of positioning the displaceable individual mirrors, use is made of actuator devices for displacing the individual mirrors and sensor devices for ascertaining the positions of the individual mirrors.

A drive device arranged in the vacuum housing of the lithography apparatus is used for driving the actuator devices and the sensor devices.

The drive device is designed for driving the multiplicity of actuator devices and sensor devices in the vacuum housing of the lithography apparatus.

However, such a central drive device in the vacuum housing of the lithography apparatus can be a large heat source, which in turn can result in stringent local cooling and the energy consumption associated with the cooling. In this case, it should be noted that, for example, EUV lithography apparatuses involve a high positional stability of the mirrors. Any kind of vibration is therefore important, for example caused by the flow of a coolant, for example water, for cooling the central control device. Furthermore, an active compensation of such vibrations involves a large control bandwidth, which in turn involves high computational capacities of the central drive device. Such high computational capacities in turn involve an increased energy expenditure and thus an increased expenditure on cooling.

Further, failure of the central drive device can cause an immediate failure of the system. On account of the arrangement of the central drive device in the vacuum housing of the lithography apparatus, the repair time in the case of such an individual fault is very long as well.

SUMMARY

The present disclosure seeks to provide an improved apparatus, for example an improved lithography apparatus.

Accordingly, an apparatus is proposed which comprises a radiation source for generating radiation, a plurality of optical components for guiding the radiation in the apparatus, a number N1 of arrays, where $N1 \geq 1$, wherein each of the N1 arrays comprises at least one actuator/sensor device which is assigned to one of the optical components, a plurality N2 of local drive units for driving the number N1 of arrays, where $N2 \geq 2$, and a number N3 of central drive units for driving the N2 local drive units, where $N3 \geq 1$.

The apparatus is, in particular, a multi-mirror system or a multi-mirror array (MMA) or a lithography apparatus.

The distributed driving of the actuator/sensor devices via the local drive units and the central drive units makes it possible to distribute the heat that arises as a result of the driving. As a result, hot spots, for example in the vacuum housing of the lithography apparatus, can be avoided and the heat distribution is harmonized and optimized.

Furthermore, the N2 local drive units and N3 central drive units afford redundant drive possibilities for the actuator/sensor devices of the N1 arrays. If an individual fault then occurs in one of the drive units, the redundant driving can be used, such that a failure of the apparatus is avoided and/or the outage time of the apparatus in the defective state is shortened.

The array having a number of actuator/sensor devices can also be referred to as a group of actuator/sensor devices.

The optical component can be for example a mirror, in particular a micromirror, i.e. a mirror having a side length of less than 1 mm, or a lens element. The optical component is displaceable, in particular. The mirror or micromirror can in particular be part of a multi-mirror array (MMA). The MMA can comprise more than 100, in particular more than 1000, in particular more than 10,000, particularly preferably more than 100,000, such mirrors. In particular, these can be mirrors for reflecting EUV radiation.

The optical component can in particular be part of a facet mirror, in particular a field facet mirror, of a beam shaping and illumination system of the lithography apparatus. Here, the optical component is arranged in particular in an evacuable chamber or a vacuum housing. During operation of the lithography apparatus, the evacuable chamber can be evacuated in particular to a pressure of less than 50 Pa, in particular less than 20 Pa, in particular less than 10 Pa, in particular less than 5 Pa. The pressure here indicates in particular the partial pressure of hydrogen in the evacuable chamber.

The radiation source is in particular an EUV radiation source having emitted used radiation in the range of between 0.1 nm and 30 nm, preferably between 4 and 6 nm. This can be a plasma source, for example a GDPP (Gas Discharge Produced Plasma) source or an LPP (Laser Produced Plasma) source. Other EUV radiation sources, for example based on a synchrotron or on a free electron laser (FEL), are also possible.

The radiation generated by the radiation source can comprise high-energy photons. In particular, high-energy photons from the radiation source, in particular EUV photons, can result in production of a plasma, in particular a hydrogen plasma. Alternatively, argon (Ar) or helium (He) can be used as purge gas. Here, for example oxygen (O) and nitrogen (N) can then be used as admixtures.

The respective unit, for example the local drive unit or the central drive unit, can be implemented in hardware. If the implementation is in hardware, the respective unit can be embodied as a device or as part of a device, for example as a computer or as a microprocessor or as a control computer or as an embedded system.

In accordance with one embodiment, each of the N2 local drive units is coupled to each of the N3 central drive units in such a way that each of the N2 local drive units is drivable by each of the N3 central drive units.

This results in redundant drive possibilities for the N2 local drive units to be driven by each of the N3 central drive units, in particular where N3≥2.

In accordance with a further embodiment, each of the N2 local drive units is connected to at least two of the N1 arrays, where 2≤N2<N1.

The connection or coupling of each of the N2 local drive units to at least two of the N1 arrays results in redundant drive possibilities for the N1 arrays or the actuator/sensor devices thereof.

In accordance with a further embodiment, where N1≥2, each of the N2 local drive units is connected via a respective connection to each actuator/sensor device of a specific one of the N1 arrays.

Each local drive unit is connected via a connection to each actuator/sensor device of one of the arrays or groups. This results in redundant drive possibilities. Furthermore, this results in a unique assignment of local drive unit to the actuator/sensor devices of a specific group or array. The respective connection can be a data connection and/or a voltage supply connection.

In accordance with a further embodiment, each of the N1 arrays is connected via a primary connection to one of the N2 local drive units and via a secondary connection to a further one of the N2 local drive units or to one of the N3 central drive units, where N1≥1.

Each array is connected via a primary connection to a local drive unit and via a secondary connection to a further local drive unit or to one of the central drive units. This creates redundant links between the arrays and the local drive units or central drive units.

Embodiments are possible in which only the primary connections are used in a fault-free situation and the secondary connections are concomitantly used only in the fault situation. However, as explained in detail below, embodiments are also possible in which, in a fault-free situation, both the primary connections and the secondary connections are used, for example for fault masking.

In accordance with a further embodiment, the actuator/sensor device is embodied as an actuator device for displacing the optical component, as a sensor device for determining a position of the optical component or as an actuator and sensor device for displacing the optical component and for determining a position of the optical component.

In accordance with a further embodiment, the array is a multi-mirror array comprising a plurality N4 of mirrors, wherein at least one actuator/sensor device is assigned to each of the N4 mirrors (where N4≥2).

In accordance with a further embodiment, the central drive unit (where N3=1), the N2 local drive units and the N1 arrays are connected in a tree structure.

The tree structure is based in particular on a rooted tree in which the central drive unit forms the root, the local drive units form the inner nodes and the arrays or the actuator/sensor devices form the leaves.

Advantageously, the tree structure produces a direct connection and thus short latencies between the central drive units and the local drive units and also between the local drive units and the arrays with their actuator/sensor devices.

In accordance with a further embodiment, the N3 central drive units and the N2 local drive units are connected in a ring structure.

The ring structure can also be referred to as ring or logical ring. The ring structure has advantages in particular regarding the complexity of the wiring for the connected units, here the N3 central drive units and the N2 local drive units.

In accordance with a further embodiment, the N2 local drive units are designed jointly to map a functionality for the N1 arrays within the apparatus.

The functionality mapped jointly by the N2 local drive units is embodied for example as data processing of the data from and to the N2 arrays. The functionality can also be embodied as voltage supply of the N1 arrays.

In particular, the drive units, in particular the N2 local drive units, become synchronized with one another. By way of example, a global clock or a hierarchical clock is used for clock distribution. Synchronization by way of synchronization messages is also possible.

In accordance with a further embodiment, the N1 arrays, the N2 local drive units and the N3 central drive units are arranged in a vacuum housing of the apparatus. In this case, an external interface device for data exchange and/or for voltage supply through the vacuum housing is coupled to a respective internal interface of the N3 central drive units in such a way that the N2 local drive units are visible with respect to the external interface device as a single drive unit independently of their number N2.

By virtue of the fact that the local drive units are visible externally, that is to say in particular to the external interface device, as a single drive unit, the external driving of the local drive units is significantly simplified. By way of example, as a result, more local drive units can be added in a simple manner. However, drive units can also be taken away. In both cases, the external drivability via the external interface device advantageously does not change on account of the visibility as a single drive unit.

In accordance with a further embodiment, the N2 local drive units comprise a first subset of active local drive units and a second subset of inactive local drive units, which are switchable into an active state in a fault situation. In this case, the N3 central drive units preferably comprise a first subset of active central drive units and a second subset of inactive central drive units, which are switchable into an active state in a fault situation.

This results in clear assignments for the driving of the arrays in a fault-free situation and in a fault situation. In particular, the first subsets and the second subsets are configurable, for example via the external interface device. By way of example, as a result, it is possible to set the number of active local drive units in the first subset. It is also possible to set the assignment of the local drive units to the first subset via the external interface device. The same correspondingly applies to the configurability of the second subset.

In accordance with a further embodiment, at least one subset of the N2 local drive units comprises both active resources and redundant resources, which are inactive in a fault-free situation and which are switchable into an active state in a fault situation. In this case, at least one subset of the N3 central drive units comprises both active resources and redundant resources, which are inactive in a fault-free situation and which are switchable into an active state in a fault situation.

The resources here are taken to mean, in particular, computation resources, storage resources and/or energy provision resources, for example current supply resources.

In accordance with a further embodiment, at least one subset of the N2 local drive units is reconfigurable in a fault situation.

In accordance with a further embodiment, at least one subset of the N3 central drive units is reconfigurable in a fault situation.

In the present case, reconfigurability means, in particular, that an existing software version of the local drive unit is reparameterized. That includes, for example, changing specific parameters of the software of the local drive unit. In particular, the external interface device can be used for this change or reconfiguration, via which external interface device the user of the apparatus can perform the reconfiguration.

The reconfiguration can be carried out in particular automatically, for example in the course of automatic fault detection. Alternatively, the fault detection can be carried out automatically and the reconfiguration is effected via a user input. As a further alternative, the fault detection can be carried out via a user interaction and the downstream reconfiguration can then be carried out via a further user interaction.

In accordance with a further embodiment, at least one subset of the N2 local drive units is reprogrammable in a fault situation.

In accordance with a further embodiment, at least one subset of the N3 central drive units reprogrammable in a fault situation.

In the present case, reprogrammability means that the software version of the drive unit is exchanged or changed in parts. Consequently, existing software of the drive unit is replaced by new software. The new software can be installed onto the respective drive unit in particular via the central interface device. The reprogramming can be carried out in particular automatically, for example in the course of fault detection. Alternatively, the fault detection can be carried out automatically and the reprogramming is effected via a user input. As a further alternative, the fault detection can be carried out via a user interaction and the downstream reprogramming can then be effected via a further user interaction.

In accordance with a further embodiment, the N2 local drive units comprise a first subset of active local drive units and a second subset of redundant local drive units, which are activated even in a fault-free situation, such that the active local drive units and the redundant local drive units are designed for fault masking.

The fault masking can involve the use of masking via a majority decision, for example. Furthermore, the fault masking can advantageously involve the use of error correction codes or checksums.

In accordance with a further embodiment, the lithography apparatus is an EUV lithography apparatus.

In accordance with a further embodiment, the radiation source is an EUV radiation source, which is designed for producing EUV radiation having a predetermined repetition frequency.

In accordance with a further embodiment, the optical component is a mirror.

In accordance with a further embodiment, the optical component is an individual mirror of a field facet mirror of a beam shaping and illumination system of the lithography apparatus.

In accordance with a further embodiment, the optical component is an individual mirror of a pupil facet mirror of a beam shaping and illumination system of the lithography apparatus.

The individual mirrors are displaceable, in particular positionable, in each case via an actuator device with a plurality of electromagnetically, in particular electrostatically, operating actuators. The actuators can be produced in a batch process as a microelectromechanical system (MEMS). For details, in this respect, reference is made to document WO 2010/049 076 A1, the content of which is incorporated herein. With respect to the embodiment of the field facet mirror and with respect to the embodiment of the pupil facet mirror, reference is made to DE 10 2013 209 442 A1, the content of which is incorporated herein.

A method for operating an apparatus, for example a lithography apparatus, is additionally proposed. The apparatus comprises a radiation source for generating radiation, a plurality of optical components for guiding the radiation in the apparatus, and a number N1 of arrays, where $N1 \geq 1$, wherein each of the N1 arrays comprises at least one actuator/sensor device which is assigned to one of the optical components. The method comprises the following steps:

Driving the number N1 of arrays via a plurality N2 of local drive units, where $N2 \geq 2$, and Driving the N2 local drive units via a number N3 of central drive units, where $N3 \geq 1$.

The embodiments and features described for the proposed apparatus are correspondingly applicable to the proposed method.

Furthermore, a computer program product is proposed, which, on a program-controlled device, causes the operation of an apparatus of the method as explained above.

A computer program product, such as e.g. a computer program, can be provided or supplied, for example, as a storage medium, such as e.g. a memory card, a USB stick, a CDROM, a DVD, or else in the form of a downloadable file from a server in a network. By way of example, in a wireless communications network, this can be effected by transferring an appropriate file with the computer program product or the computer program.

Further possible implementations of the disclosure also comprise not explicitly mentioned combinations of features or embodiments described above or below with respect to the exemplary embodiments. In this case, the person skilled in the art will also add individual aspects as improvements or supplementations to the respective basic form of the disclosure.

Further advantageous configurations and aspects of the disclosure are the subject matter of the dependent claims and also of the exemplary embodiments of the disclosure described below.

BRIEF DESCRIPTION OF THE DRAWINGS

The disclosure is explained in greater detail below on the basis of preferred embodiments with reference to the accompanying figures, in which.

DESCRIPTION OF EXEMPLARY EMBODIMENTS

Identical elements or elements having an identical function have been provided with the same reference signs in the figures, unless indicated otherwise. It should also be noted that the illustrations in the figures are not necessarily true to scale.

Figure 1:
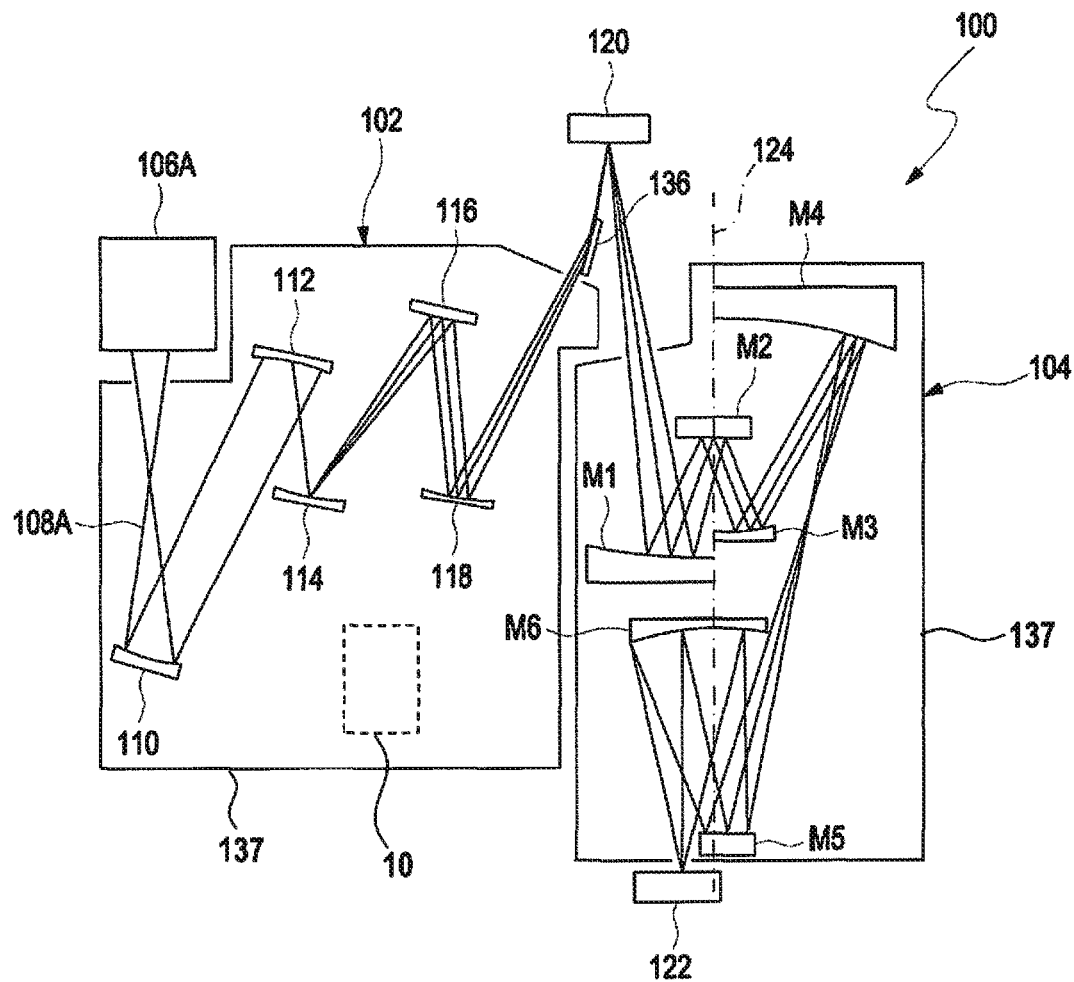
FIG. 1 shows a schematic view of an EUV lithography apparatus.

FIG. 1 shows a schematic view of an EUV lithography apparatus 100 as an exemplary apparatus, which comprises a beam shaping and illumination system 102 and a projection system 104. Here, EUV stands for "extreme ultraviolet" and denotes a wavelength of the operating light of between 0.1 and 30 nm. The beam shaping and illumination system 102 and the projection system 104 are respectively provided in a vacuum housing 137, each vacuum housing being evacuated using an evacuation device that is not illustrated in more specific detail. The vacuum housings are surrounded by a machine room not illustrated in more specific detail. Electrical controllers and the like can also be provided in this machine room.

The EUV lithography apparatus 100 comprises an EUV radiation source or EUV light source 106A. A plasma source which emits radiation 108A in the EUV range (extreme ultraviolet range), that is to say for example in the wavelength range of 0.1 nm to 30 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 depicted in FIG. 1 has five mirrors 110, 112, 114, 116, 118. After passing through the beam shaping and illumination system 102, the EUV radiation 108A is directed onto the photomask (reticle) 120. The photomask 120 is likewise formed as a reflective optical element and can be arranged outside the systems 102, 104. Furthermore, the EUV radiation 108A can be directed onto the photomask 120 via a mirror 136. The photomask 120 has a structure which is imaged onto a wafer 122 or the like in a reduced fashion via the projection system 104.

The projection system 104 has six mirrors M1-M6 for imaging the photomask 120 onto the wafer 122. In this case, individual mirrors M1-M6 of the projection system 104 can be arranged symmetrically in relation to the optical axis 124 of the projection system 104. It should be noted that the number of mirrors of the EUV lithography apparatus 100 is not restricted to the number illustrated. More or fewer mirrors can also be provided. Furthermore, the mirrors M1-M6 are generally curved on their front side for beam shaping.

Furthermore, the EUV lithography apparatus 100 in FIG. 1 comprises a drive device 10 designed for driving the optical components 110, 112, 114, 116, 118, M1-M6. The drive device can be arranged in the beam shaping and illumination system 102 and/or in the projection system 104. In particular, the drive device 10 comprises a number N1 of arrays 210-260, a plurality N2 of local drive units 410, 420, 430, 440, 450, 460 and a number N3 of central drive units 510, 520. Details concerning the drive device 10 are explained in detail below with reference to FIGS. 2 to 4.

Figure 2:
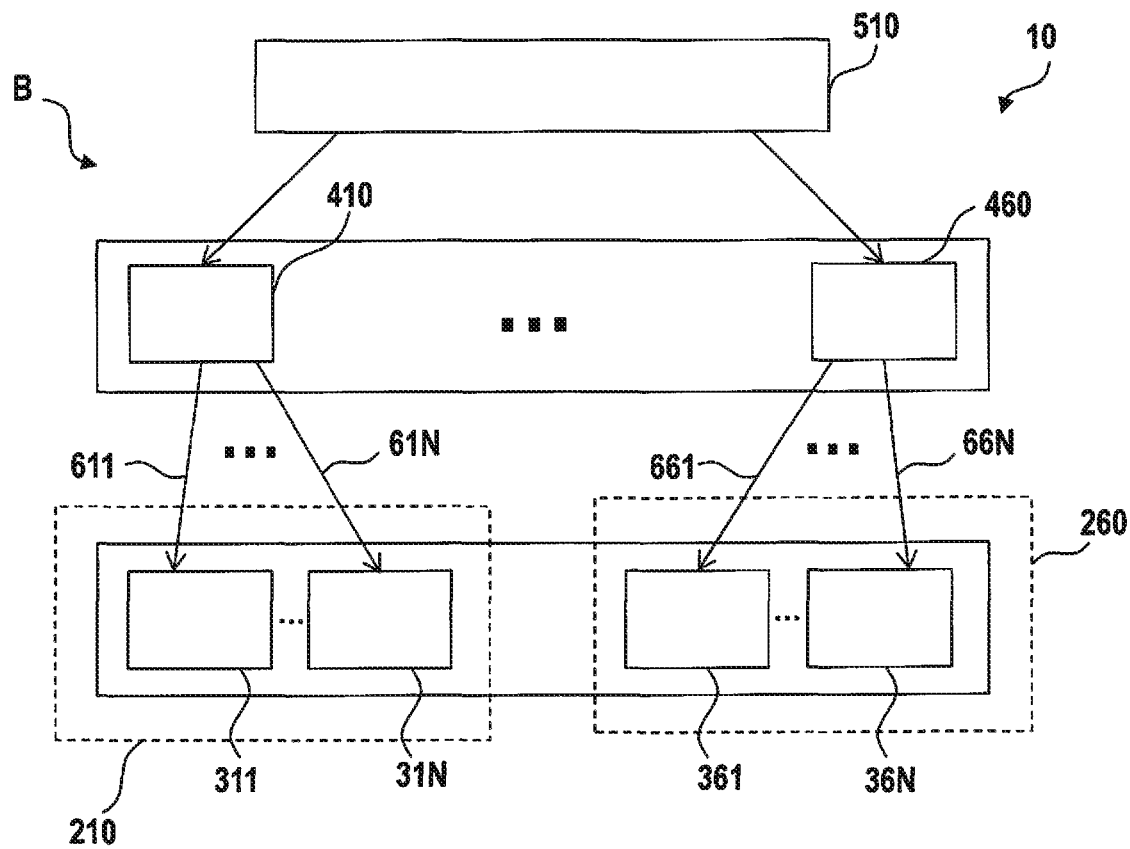
FIG. 2 shows a schematic view of a first embodiment of a drive device for a lithography apparatus.
Figure 3:
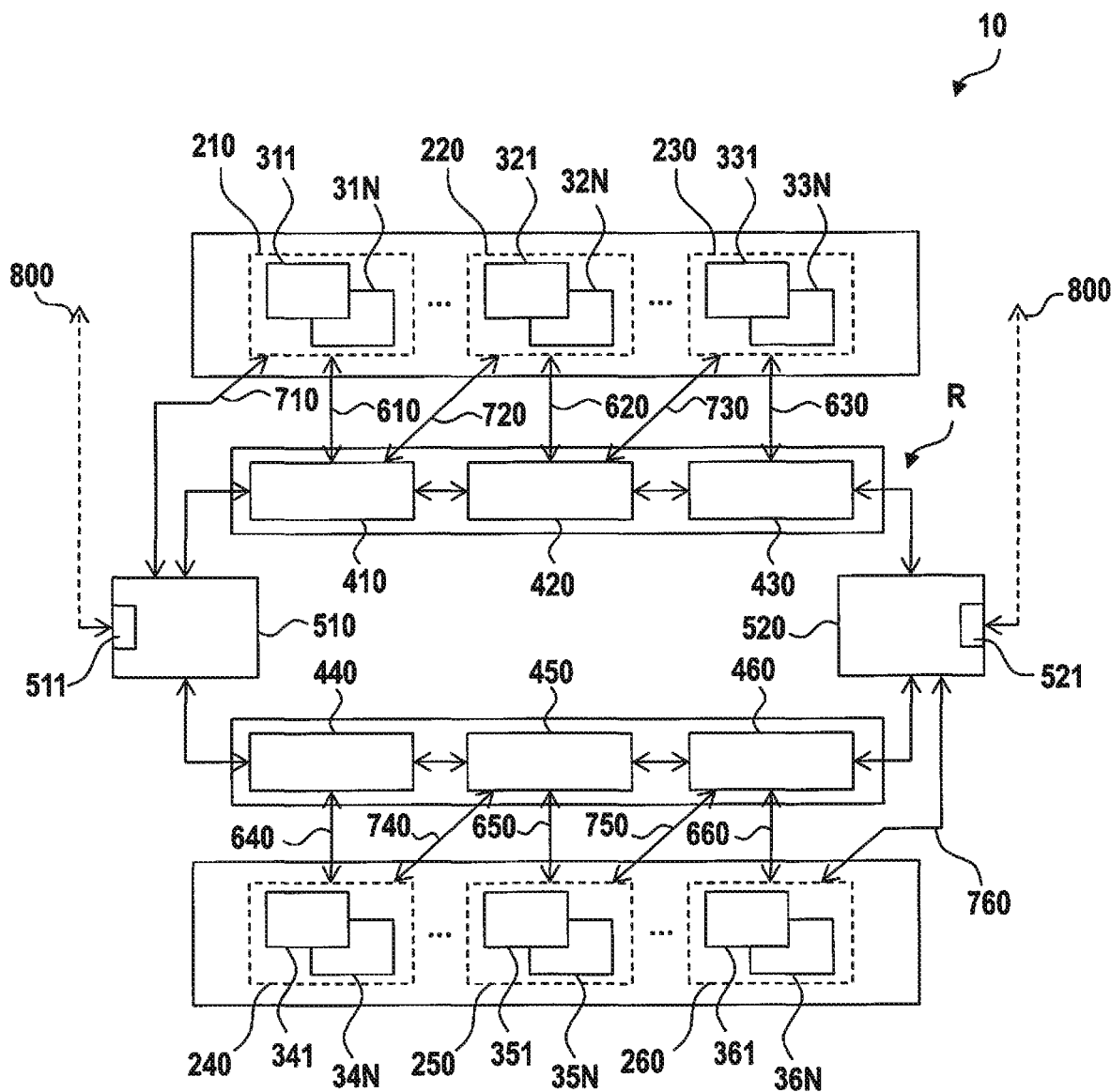
FIG. 3 shows a schematic view of a second embodiment of a drive device for a lithography apparatus.

In this case, FIG. 2 shows a schematic view of a first embodiment of a drive device 10 and FIG. 3 shows a schematic view of a second embodiment of a drive device 10 for a lithography apparatus 100. The two embodiments of the drive device 10 in FIGS. 2 and 3 have the following properties in common:

The drive device 10 comprises a number N1 of arrays, where N1≥1, wherein each of the N1 arrays 210-260 comprises at least one actuator/sensor device 311-31N; 321-32N, 331-33N; 341-34N; 351-35N; 361-36N which is assigned to one of the optical components 110, 112, 114, 116, 118. The actuator/sensor device 311-31N; 321-32N, 331-33N; 341-34N; 351-35N; 361-36N is, for example, an actuator device for displacing the optical component 110, 112, 114, 116, 118, a sensor device for determining a position of the optical component 110, 112, 114, 116, 118 or an actuator and sensor device for displacing the optical component 110, 112, 114, 116, 118 and for determining a position of the optical component 110, 112, 114, 116, 118.

Furthermore, each of the two embodiments of the drive device 10 comprises a plurality N2 of local drive units 410, 420, 430, 440, 450, 460 for driving the number N1 of arrays 210-260, where N2≥2. Moreover, each of the embodiments of the drive device 10 comprises a number N3 of central drive units 510, 520 for driving the N2 local drive units 410, 420, 430, 440, 450, 460, where N3≥1. In this case, N1, N2, N3, and N4 are natural numbers, in particular.

Each of the N2 local drive units 410, 420, 430, 440, 450, 460 is coupled to each of the N3 central drive units 510, 520 in such a way that each of the N2 local drive units 410, 420, 430, 440, 450, 460 is drivable by each of the N3 central drive units 510, 520. Furthermore, each of the N2 local drive units 410, 420, 430, 440, 450, 460 is connected to at least two of the N1 arrays 210-260, where 2≤N2<N1. The different details of the two embodiments of the drive device 10 in FIGS. 2 and 3 are discussed below.

In accordance with FIG. 2, the drive device 10 comprises one central drive unit 510 (N3=1), six local drive units 410-460 (N2=6) and 6·N actuator/sensor devices 311-31N; 321-32N, 331-33N; 341-34N; 351-35N; 361-36N. Without restricting the generality, in the embodiment in FIG. 2, N2=6 and N1=6·N. The central drive unit 510, the six local drive units 410, 420, 430, 440, 450, 460 and the 6·N arrays 210-260 in FIG. 2 are arranged in a tree structure B. The tree structure B in FIG. 2 is based on a rooted tree in which the central drive unit 510 forms the root, the local drive units 410-460 form the inner nodes and the arrays 210-260 form the leaves.

Each of the N2 (N2=6) local drive units 410, 420, 430, 440, 450, 460 in FIG. 2 is connected via a respective connection 611, 61N; 661, 66N to each actuator/sensor device 311-31N; 321-32N, 331-33N; 341-34N; 351-35N; 361-36N of a specific one of the N1 arrays 210-260. In this regard, by way of example, the local drive unit 410 is connected to all the actuator/sensor devices 311-31N of the first array 210 via the connections 611-61N.

FIG. 3 shows a schematic view of a second embodiment of a drive device 10 for a lithography apparatus 100.

In the second embodiment of the drive device 10 in FIG. 3, two central drive units 510, 520 (N3=2), six local drive units 410-460 (N2=6), six arrays 210-260 (N1=6) and a plurality N4 of actuator/sensor devices 311-31N; 321-32N, 331-33N; 341-34N; 351-35N; 361-36N (N4=N1·N) are provided. In the example in FIG. 3, each of the arrays 210-260 comprises N actuator/sensor devices 311-31N; 321-32N, 331-33N; 341-34N; 351-35N; 361-36N. Without restricting the generality, N can be identical or else different for all the arrays 210-260.

The N3 central drive units 510, 520 and the N2 local drive units 410, 420, 430, 440, 450, 460 in FIG. 3 are connected to one another in a ring structure R.

Each of the N1 arrays 210-260 is connected via a primary connection 610-660 to one of the N2 local drive units 410, 420, 430, 440, 450, 460 and via a secondary connection 710-760 to a further one of the N2 local drive units 410, 420, 430, 440, 450, 460 or to one of the N3 central drive units 510, 520. This creates redundant links between the arrays 210-260 and the local drive units 410, 420, 430, 440, 450, 460 or the central drive units 510, 520.

Embodiments are possible in which only the primary connections 610-660 are used in a fault-free situation and the secondary connections 710-760 are concomitantly used only in the fault situation. However, embodiments are also possible in which both the primary connections 610-660 and the secondary connections 710-760 are used in a fault-free situation. Details in this respect are evident from the following:

By way of example, the N2 local drive units 410, 420, 430, 440, 450, 460 can comprise a first subset of active local drive units and a second subset of inactive local drive units, which are switchable into an active state in a fault situation. In this case, the N2 central drive units 510, 520 can also comprise a first subset of active central drive units and a second subset of inactive central drive units, which are switchable into an active state in a fault situation.

Alternatively or additionally, at least one subset of the N2 local drive units 410, 420, 430, 440, 450, 460 can comprise both active resources and redundant resources, which are inactive in a fault-free situation and which are switchable into an active state in a fault situation. In this case, preferably, at least one subset of the N3 central drive units 510, 520 can also comprise both active resources and redundant resources, which are inactive in a fault-free situation and which are switchable into an active state in a fault situation.

Alternatively or additionally, at least one subset of the N2 local drive units 410, 420, 430, 440, 450, 460 can be reconfigurable or reprogrammable in a fault situation. Correspondingly, at least one subset of the N3 central drive units 510, 520 can be reconfigurable or reprogrammable in a fault situation.

Furthermore, it is possible for the N2 local drive units 410, 420, 430, 440, 450, 460 to comprise a first subset of active local drive units and a second subset of redundant local drive units, which are activated even in a fault-free situation, such that the active local drive units and the redundant local drive units are designed for fault masking.

In particular, the N1 arrays 210-260, the N2 local drive units 410, 420, 430, 440, 450, 460 and the N3 central drive units 510, 520 are arranged in the vacuum housing 137 of the apparatus 110. Furthermore, the central drive units 510, 520 preferably each comprise an internal interface device 511, 521. The internal interface devices 511, 521 are coupled to an external interface device 800 for data exchange and/or for voltage supply through the vacuum housing 137 in such a way that the N2 local drive units 410, 420, 430, 440, 450, 460 are visible with respect to the external interface device 800 as a single drive unit. For reasons of clarity, the external interface device 800 is indicated in FIG. 3 only by the data communication arrows from the internal interface devices 511, 521 toward the outside. By virtue of the fact that the N2 local drive units 410, 420, 430, 440, 450, 460 are visible with respect to the external interface device 800 as a single drive unit, the external driving of the local drive units 410, 420, 430, 440, 450, 460 is significantly simplified. It is also possible as a result, in a simple manner, for more local drive units 410, 420, 430, 440, 450, 460 to be added or else taken away. The external controllability via the external interface device 800 accordingly does not change on account of the visibility as a single drive unit.

Figure 4:
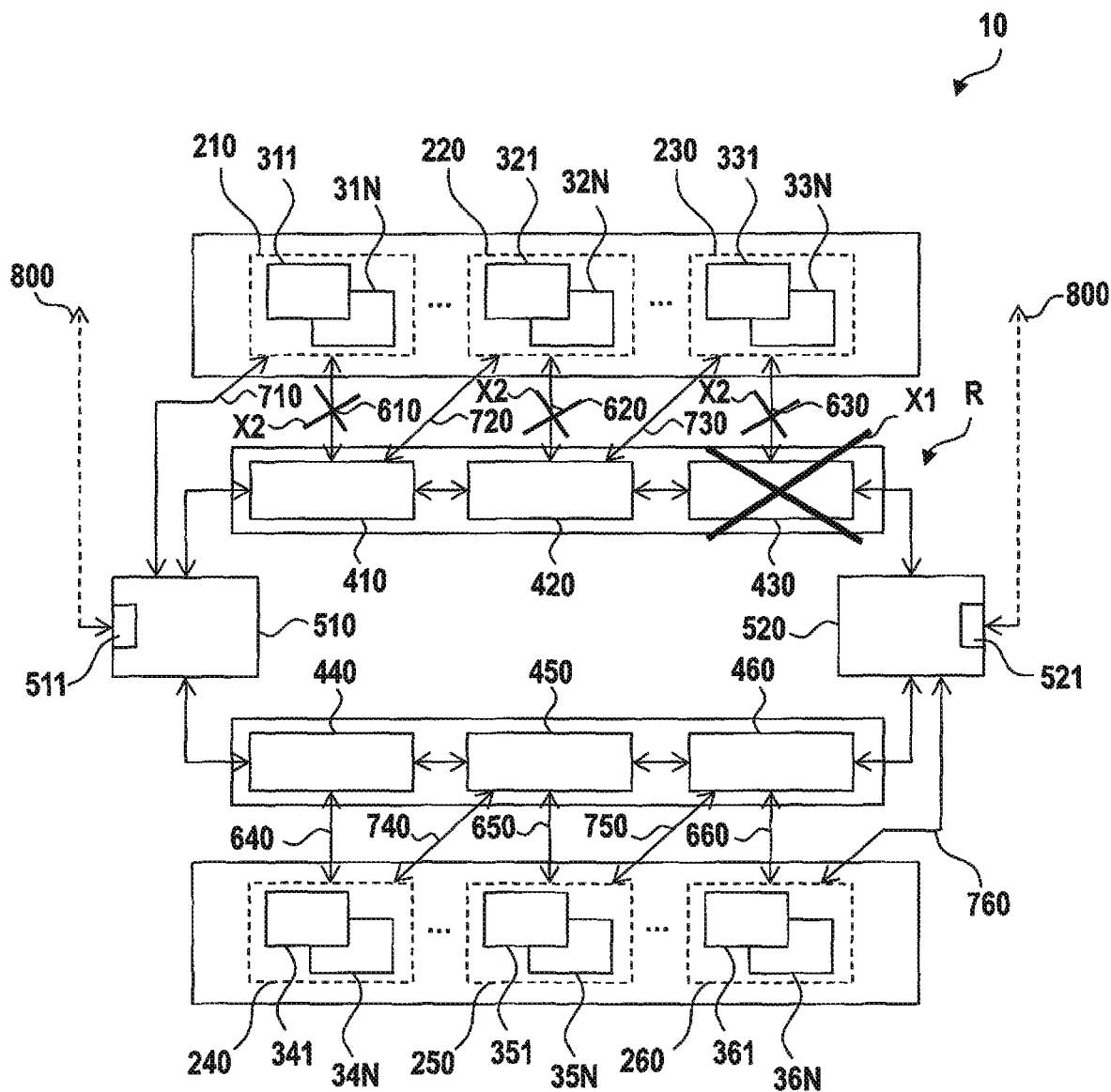
FIG. 4 shows a schematic view of the second embodiment of the drive device for a lithography apparatus in accordance with FIG. 3 in a fault situation.

FIG. 4 illustrates a schematic view of the second embodiment of the drive device 10 in accordance with FIG. 3 in a fault situation. In the example in FIG. 4, it is assumed that the local drive unit 430 has failed. In this respect, the reference sign X1 shows this primary failure of the defective local drive unit 430. On account of the initial failure of the local drive unit 430, the array 230 can no longer be driven via its primary connection 630. This absent driving via the primary connection 630 is identified via a cross with the reference sign X2. In order to compensate for the failure of the drive unit 430, the drive unit 420 undertakes the driving of the array 230 via the secondary connection 730. As a consequence, the array 220 can no longer be driven via its primary connection 620. This absent driving via the primary connection 620 is in turn identified via a cross with the reference sign X2. According to the same principle, the drive unit 410 undertakes the driving of the array 220 via the secondary connection 720 and the drive unit 510 undertakes the driving of the array 210 via the secondary connection 710. The drive unit 510 can undertake the driving of the array 210 in addition to its other tasks since it has additional resources that are not required in the fault-free operating situation. The chain of the undertaking drive units can be extended to more than ten drive units, in particular to more than twenty drive units.

Figure 5:
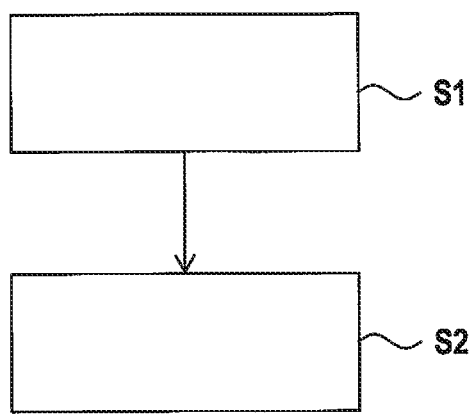
FIG. 5 shows one embodiment of a method for operating an apparatus.

FIG. 5 shows one embodiment of a method for operating an apparatus 100. The apparatus 100 is, for example, an EUV lithography apparatus as illustrated in FIG. 1. The apparatus 100 comprises a radiation source 106A for generating radiation, a plurality of optical components 110, 112, 114, 116, 118 for guiding the radiation in the apparatus 100, and a number N1 of arrays 210-260, where N1≥1, wherein each of the N1 arrays 210-260 comprises at least one actuator/sensor device 311-31N; 321-32N, 331-33N; 341-34N; 351-35N; 361-36N which is assigned to one of the optical components 110, 112, 114, 116, 118.

The method in FIG. 5 comprises the following steps S1 and S2:

Step S1 involves driving the number N1 of arrays 210-260 via a plurality N2 of local drive units 410, 420, 430, 440, 450, 460, where N2≥2.

Step S2 involves driving the N2 local drive units 410, 420, 430, 440, 450, 460 via a number N3 of central drive units 510, 520, where N3≥1.

Although the present disclosure has been described on the basis of exemplary embodiments, it is modifiable in diverse ways.

LIST OF REFERENCE SIGNS

10 Drive device
100 Lithography apparatus
102 Beam shaping and illumination system
104 Projection system
106A Radiation source, EUV light source
108A EUV radiation
110 Mirror
112 Mirror
114 Mirror
116 Mirror
118 Mirror
120 Photomask
122 Wafer
124 Optical axis of the projection system
136 Mirror
137 Vacuum housing
210-260 Array
311-31N Actuator/sensor device
321-32N Actuator/sensor device
331-33N Actuator/sensor device
341-34N Actuator/sensor device
351-35N Actuator/sensor device
361-36N Actuator/sensor device
410-440 Local drive unit
510, 520 Central drive unit
511 Internal interface device
521 Internal interface device
610-660 Primary connection
710-760 Secondary connection
800 External interface device
B Tree structure
M1-M6 Mirrors
R Ring structure
S1, S2 Method step
X1 Primary failure
X2 Secondary failure

What is claimed is:

1. An apparatus, comprising:
a vacuum housing;
a plurality of optical components configured to guide radiation in the apparatus;
a number N1 of arrays, each array comprising an actuator/sensor device assigned to one of the optical components;
a number N2 of local drive units configured to drive the N1 arrays;
a number N3 of central drive units configured to drive the N2 local drive units, the N3 central drive units comprising an internal interface device; and
an external interface device configured to provide data exchange and/or voltage supply through the vacuum housing,
wherein:
N2≥2;
the N1 arrays, the N2 local drive units, and the N3 central drive units are in the vacuum housing;
the external interface device is coupled to the internal interface device so that the N2 local drive units are visible with respect to the external interface device as a single drive unit independently of their number N2; and
the N3 central drive units and the N2 local drive units are connected in a ring structure.

2. The apparatus of claim 1, wherein each of the N2 local drive units is coupled to each of the N3 central drive units so that each of the N2 local drive units is drivable by each of the N3 central drive units.

3. The apparatus of claim 1, wherein each of the N2 local drive units is connected to at least two of the N1 arrays, and N2≤N1.

4. The apparatus of claim 1, wherein, where N1≥2, and each of the N2 local drive units is connected via a respective connection to each actuator/sensor device of a specific one of the N1 arrays.

5. The apparatus of claim 1, wherein:
each of the N1 arrays is connected via a primary connection to one of the N2 local drive units; and
each of the N1 arrays is connected via a secondary connection to: i) a further one of the N2 local drive units; or ii) one of the N3 central drive units.

6. The apparatus of claim 1, wherein:
the actuator/sensor device comprises an actuator device configured to displace its optical component;
the actuator/sensor device comprises a sensor device configured to determine a position of its optical component; or
the actuator/sensor device comprises an actuator and a sensor device configured to displace the optical component and to determine a position of its optical component.

7. The apparatus of claim 1, wherein the apparatus comprises a multi-mirror system.

8. The apparatus of claim 1, wherein the apparatus comprises a lithography apparatus.

9. The apparatus of claim 1, wherein the apparatus comprises an EUV lithography apparatus.

10. The apparatus of claim 1, wherein each of the plurality of optical components comprises a mirror.

11. The apparatus of claim 1, wherein:
where N3=1; and
the central drive unit, the N2 local drive units and the N1 arrays are connected in a tree structure.

12. The apparatus of claim 1, wherein:
the N2 local drive units comprise a first subset of active local drive units and a second subset of inactive local drive units, which are switchable into an active state in a fault situation; and
the N3 central drive units comprise a first subset of active central drive units and a second sub-set of inactive central drive units, which are switchable into an active state in a fault situation.

13. The apparatus of claim 1, wherein:
a subset of the N2 local drive units comprises both active resources and redundant resources, which are inactive in a fault-free situation and which are switchable into an active state in a fault situation; and
a subset of the N3 central drive units comprises both active resources and redundant resources, which are inactive in a fault-free situation and which are switchable into an active state in a fault situation.

14. The apparatus of claim 1, wherein:
each of the N2 local drive units is coupled to each of the N3 central drive units so that each of the N2 local drive units is drivable by each of the N3 central drive units; N1≥2; and
each of the N2 local drive units is connected via a respective connection to each actuator/sensor device of a specific one of the N1 arrays.

15. An apparatus, comprising:
a vacuum housing;
a plurality of optical components configured to guide radiation in the apparatus;
a number N1 of arrays, each array comprising an actuator/sensor device assigned to one of the optical components;
a number N2 of local drive units configured to drive the N1 arrays;
a number N3 of central drive units configured to drive the N2 local drive units, the N3 central drive units comprising an internal interface device; and
an external interface device configured to provide data exchange and/or voltage supply through the vacuum housing,
wherein:
N2≥2;
the N1 arrays, the N2 local drive units, and the N3 central drive units are in the vacuum housing;
the external interface device is coupled to the internal interface device so that the N2 local drive units are visible with respect to the external interface device as a single drive unit independently of their number N2;
a subset of the N2 local drive units is reconfigurable or reprogrammable in a fault situation; and
a subset of the N3 central drive units is reconfigurable or reprogrammable in a fault situation.

16. The apparatus of claim 15, wherein the N2 local drive units comprise a first subset of active local drive units and a second subset of redundant local drive units, which are activatable even in a fault-free situation, so that the active local drive units and the redundant local drive units are designed for fault masking.

17. The apparatus of claim 15, wherein:
where N3=1; and
the central drive unit, the N2 local drive units and the N1 arrays are connected in a tree structure.

18. An apparatus, comprising:
a vacuum housing;
a plurality of optical components configured to guide radiation in the apparatus;
a number N1 of arrays, each array comprising an actuator/sensor device assigned to one of the optical components;
a number N2 of local drive units configured to drive the N1 arrays;
a number N3 of central drive units configured to drive the N2 local drive units, the N3 central drive units comprising an internal interface device; and
an external interface device configured to provide data exchange and/or voltage supply through the vacuum housing,
wherein:
N2≥2;
the N1 arrays, the N2 local drive units, and the N3 central drive units are in the vacuum housing;
the external interface device is coupled to the internal interface device so that the N2 local drive units are visible with respect to the external interface device as a single drive unit independently of their number N2;
each of the N2 local drive units is coupled to each of the N3 central drive units so that each of the N2 local drive units is drivable by each of the N3 central drive units;
each of the N2 local drive units is connected to at least two of the N1 arrays; and
N2≤N1.

19. The apparatus of claim 18, wherein, where N1≥2, and each of the N2 local drive units is connected via a respective connection to each actuator/sensor device of a specific one of the N1 arrays.

20. The apparatus of claim 18, wherein:
where N3=1; and
the central drive unit, the N2 local drive units and the N1 arrays are connected in a tree structure.

* * * * *

UNITED STATES PATENT AND TRADEMARK OFFICE
CERTIFICATE OF CORRECTION

PATENT NO. : 10,838,307 B2  
APPLICATION NO. : 16/520047  
DATED : November 17, 2020  
INVENTOR(S) : Markus Holz and Ulrich Bihr Page 1 of 1

It is certified that error appears in the above-identified patent and that said Letters Patent is hereby corrected as shown below:

In the Specification

Column 5, Line 51, after "units" insert -- is --;

Column 6, Line 59, delete "CDROM," and insert -- CD-ROM, --.

Signed and Sealed this  
Ninth Day of February, 2021

Drew Hirshfeld  
*Performing the Functions and Duties of the*  
*Under Secretary of Commerce for Intellectual Property and*  
*Director of the United States Patent and Trademark Office*